United States Patent [19]

Anthony

[11] Patent Number: 4,628,174
[45] Date of Patent: Dec. 9, 1986

[54] FORMING ELECTRICAL CONDUCTORS IN LONG MICRODIAMETER HOLES

[75] Inventor: Thomas R. Anthony, Schenectady, N.Y.

[73] Assignee: General Electric Company, Schenectady, N.Y.

[21] Appl. No.: 651,014

[22] Filed: Sep. 17, 1984

[51] Int. Cl.⁴ .............................................. B23K 28/00
[52] U.S. Cl. ................................. 219/76.13; 118/620; 427/37
[58] Field of Search ........................... 219/76.13, 76.1; 118/620, 638; 427/12, 37, 97

[56] References Cited

U.S. PATENT DOCUMENTS 3,562,009  2/1971  Cranston et al. ...................... 427/97
4,505,948  3/1985  Pinkhasov ............................. 427/37

FOREIGN PATENT DOCUMENTS 49-16706  4/1974  Japan ................................... 219/76.1

OTHER PUBLICATIONS

"Forming Electrical Interconnections Through Semiconductor Wafers" by T. R. Anthony, J. Appl. Physics, 52(8), 5340 (1981).

"Forming Feedthroughs in Laser-Drilled Holes in Semiconductor Wafers by Double-Sided Sputtering": by T. R. Anthony, IEEE Trans. CHMT-5(1), 1971 (1982).

"Diodes Formed by Laser Drilling and Diffusion" by T. R. Anthony, J. Appl. Phys., 53(12), 9154 (1982).

*Primary Examiner*—Clifford C. Shaw
*Attorney, Agent, or Firm*—Francis T. Coppa; James C. Davis, Jr.; James Magee, Jr.

[57] ABSTRACT

A conductor is provided through a narrow bore hole of a wafer. The hole has a length-to-diameter ratio in excess of six. The conductor is formed by condensation of metal vapor generated at the bottom of said hole by a spark. The spark is generated between a vaporizable metal at the bottom of the hole and a thin electrode disposed above the hole from a conventional automobile coil and battery operating through a mercury switch.

4 Claims, 9 Drawing Figures

FORMING ELECTRICAL CONDUCTORS IN LONG MICRODIAMETER HOLES

BACKGROUND OF THE INVENTION

The present invention relates generally to the formation of electrical conductors in holes of relatively narrow diameter and extended length. More specifically, it relates to formation of electrical conductors in holes through insulating materials which had diameters of the order of 1 micron and which have lengths which are a factor of 6 or more times the diameter of the hole.

It is known that laser drilling can produce holes with length-to-diameter ratios which are relatively high for small diameter holes. Satisfactory methods exist for forming electrical conductors or feed-throughs in holes of insulating substrates for holes whose length-to-diameter ratio is less than 6. In other words, where the diameter of the hole is of the order of a micron in size and the length of the hole is about 6 microns corresponding to the thickness of the material in which the hole is formed, the conventional practices now in use are successful in forming a conductive bridge through the hole from one wafer surface of the material to the opposite wafer surface. The methods which have been employed in successfully bridging the two surfaces of an article include capillary wetting, wedge extrusion, wire insertion, electroless plating, electroforming and double-sided sputtering in conjunction with through-hole plating. These are among the various methods which have been tried to implant a conducting electrical interconnection in a micron diameter hole whose length is much greater than its diameter. However, when the length is more than 6 times greater than the diameter, these methods are not successful in forming a conductor or implanting a conductive path through the material from one major surface to an opposite parallel major surface on the other side of a disk, for example. For micron-diameter holes with a length-to-diameter ratio greater than 6, none of the known methods has been found successful for implanting a conductor with a high yield.

Electrical interconnections through such holes or in such holes are important because laser drilling can produce holes with length-to-diameter ratios which are quite high and as high as 50. The smallest possible hole diameter is desired in many structures such as electronic circuitry in order to conserve available surface area of the structures, also sometimes referred to as conserving real estate. Surprisingly, I have now found a simple inexpensive method of forming an electrically conductive coating on the walls of micron-sized holes with very large length-to-diameter ratios and in similar small diameter holes with large length-to-diameter ratios.

BRIEF STATEMENT OF THE INVENTION

Accordingly, it is one object of the present invention to provide a method for forming a conductive path through a fine hole having a length-to-diameter ratio greater than 6.

Another object is to provide a wafer which contains small diameter holes having a length-to-diameter ratio of greater than 6 and having an electrical conductor extending through the hole.

Another object is to provide an insulating wafer having a micron sized hole extending therethrough from one major surface to the other and having a conductive material providing electrical connection between the respective major surfaces of the wafer where the length-to-diameter ratio of the hole is greater than 6.

Another object is to provide a wafer having a plurality of micron sized holes therethrough and the diameter of which is less than 1/6th of the thickness of the wafer, and having a conductor extending through the length of the hole from wafer surface to wafer surface.

Another object is to provide a method of forming conductors in laser holes having length-to-diameter ratios of greater than 6.

Another object is to provide a method of forming conductors through insulating wafers having length-to-diameter ratios as high as 50.

Other objects will be in part apparent and in part pointed out in the description which follows.

In one of its broader aspects objects of the present invention can be achieved by placing a wafer containing the micron-sized hole into intimate contact with the surface of the metal body, setting a conductive electrode into proximity with the open end of the hole, establishing an electrical potential between the metal body and the wire to cause a spark discharge therebetween and to vaporize metal of the metal body through the length of the hole thereby forming a conductor extending through the length of the hole.

BRIEF DESCRIPTION OF THE DRAWINGS

The present invention will be understood with greater clarity from the description which follows by reference to the accompanying drawings in which.

DETAILED DESCRIPTION OF THE INVENTION

Figure 1:
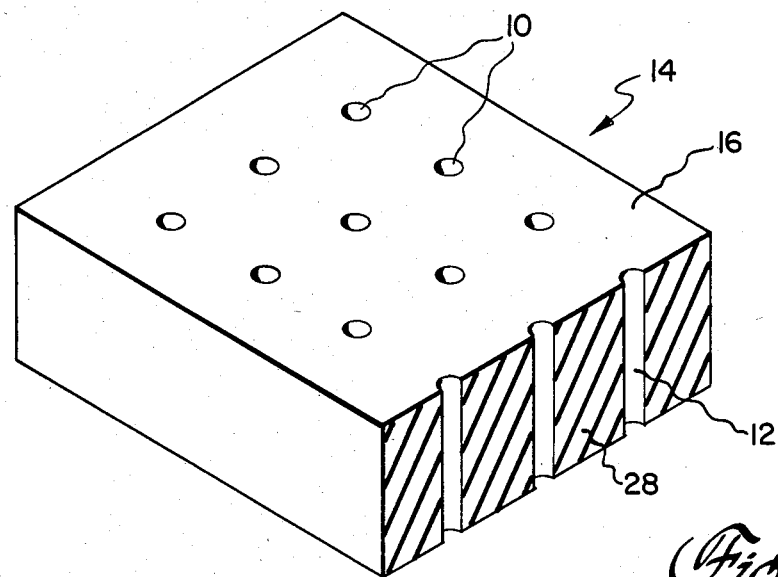
FIG. 1 is a perspective view in part in section of a insulating body having a number of holes drilled therethrough the ratio of the diameter to the length of which is greater than 6.

Referring now first to FIG. 1, a portion of a wafer 14 of insulating material is illustrated in perspective and in part in section. The wafer has a number of holes 10 arranged in whatever pattern is suitable for the particular end-use to be made of the wafer. The holes 10 are drilled, as by laser drilling, to have a relatively high ratio of length-to-diameter. For example, the hole 12, which is shown in section at one side of the wafer 14 may have a ratio of 8 or 10 or 12. Ratios as high as 50 are producable using laser drilling technology. However, it is extremely difficult to drill these holes with a conductor to permit conduction of electricity through the wafer and from one surface such as the upper surface 16 to an opposite surface such as the lower surface 18.

Figure 8:
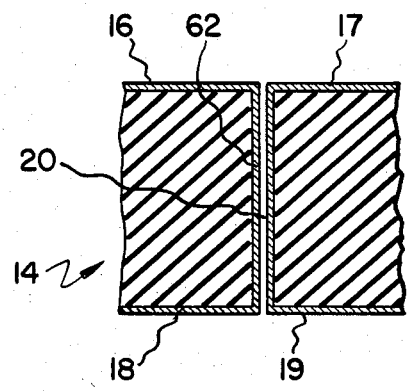
FIG. 8 is a section similar to that of FIG. 7 but with the upper and lower surfaces coated with conductor.

Suitable conductors may be formed on the surfaces 16 or 18 as needed to provide conduction along the surface and to connect any conductor extending through a hole such as 12 to the conductors provided on the surface. Such surface conductor and through-hole conductor are illustrated in FIG. 8. Such structure is formed by the technology of the present invention.

Figure 2:
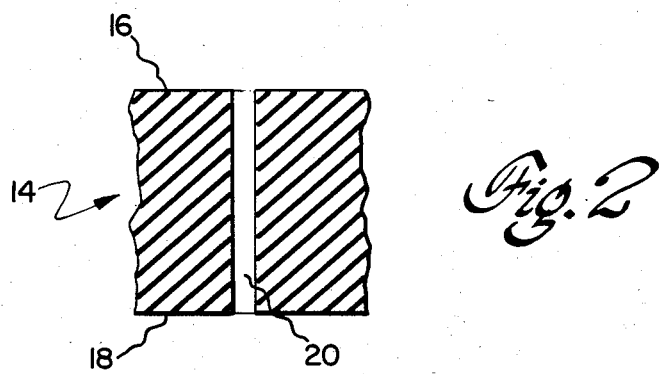
FIG. 2 is a cross-sectional view of a portion of the article in FIG. 1 illustrating one hole extending through the insulating wafer.

Referring next to FIG. 2, a portion of the wafer 14 is illustrated in section with a particular hole 20 having a length-to-diameter ratio in excess of 6. The wafer is itself an insulating wafer and there is no means for conduction from an upper surface such as 16 to a lower surface such as 18 of the particular portion of wafer 14 where hole 20 is located, except if one is formed through the narrow diameter through-hole 20.

Figure 3:
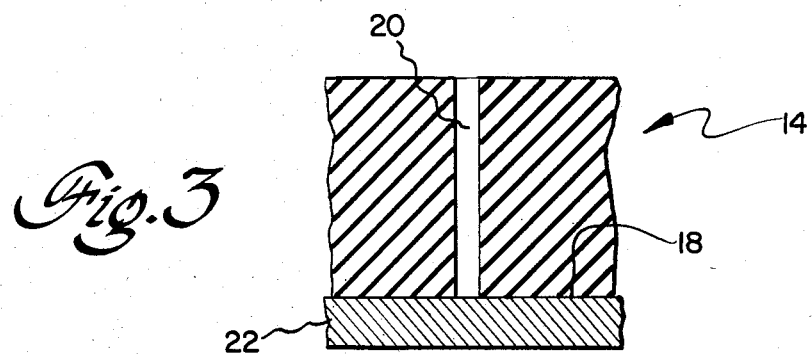
FIG. 3 is the article of FIG. 2 to which a metal body has been placed in intimate contact with one surface thereof.

Referring next to FIG. 3, the first step which is taken to provide a through-hole conductor in the hole 20 is to bring a conductive metal body 22 into very close contact with the one surface, in this case the lower surface 18 of the wafer 14. The metal body which is brought into contact should preferably be pressed very firmly against the substrate coating material 22 to provide a good seal between them. The object of the good seal is to prevent a large portion of any material vaporized from the spark discharge, as described below, to expand along the interface between the wafer 14 and the body 22 rather than to restrict its movement up through hole 20. The metal of body 22 may be any suitable conductive element or alloy which will vaporize in response to spark discharge to form a deposit along the inner walls of hole 20 and to form thereby a conductive path along the wall and through hole 20. Copper or other conductor may be employed for this purpose.

Figure 4:
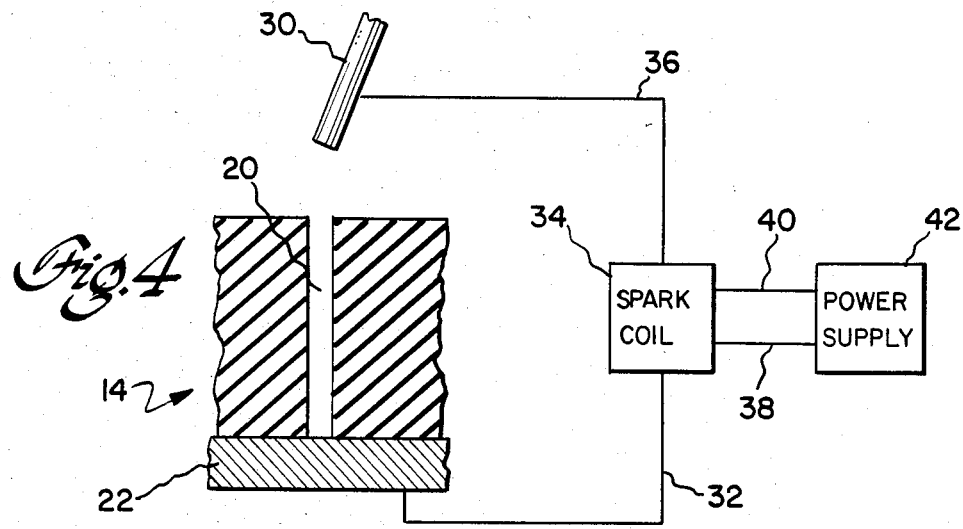
FIG. 4 is the the article of FIG. 3 having the metal object at the bottom thereof and having an electrode poised over the opposite end of the hole and electrically connected to the body through a control box.

Spark discharge referred to above is now described with reference to FIG. 4. In this figure, the wafer 14 is positioned between a body 22 of substrate coating material and a wire electrode 30. The body 22 of coating material may be a body of a metal such as copper, aluminum, brass or zinc. It is connected through the conductor 32, the spark coil 34, conductor 36 to the wire electrode 30. The power may be supplied to coil 34 through the conductors 38 and 40 from a power supply 42 which may be a 12 volt battery such as is commonly used in an automobile.

Figure 5:
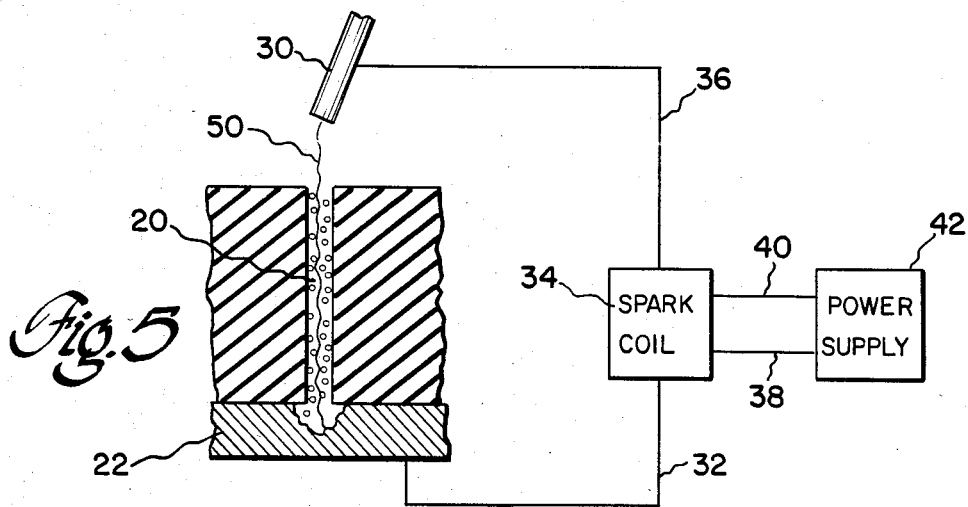
FIG. 5 is a similar section illustrating a spark extending from the wire electrode through the hole to the metal body and the resultant spark illustrating vaporization of metal from the metal body.

The operation of the apparatus of the present invention is illustrated in FIG. 5. In this figure, a spark discharge 50 eminates from wire 30, passes through the hole 20 and vaporizes a portion of the body of substrate coating material 22 at the lower end of the hole 20. The hot vaporized material expands and passes up through the hole as a vapor and condenses on the relatively cooler surfaces of the hole.

I have found that the spark passes down the hole even if the wire is not precisely located over the center of the hole. In other words, the wire does not have to be aligned perfectly with the center line of the hole in order for an effective spark to be created and to cause a vaporization of the material of the body 22 at the lower end of the hole.

Further, I have found that sparks were able to go down holes which were somewhat irregular and even curved holes. By irregular or curved holes, I refer to holes where the entrance and exit of the hole were not aligned and where the path between the entrance and exit of the hole were not aligned and where the path between the entrance and exit was not entirely a straight line path.

An important factor in successfully coating the walls of the hole was to insure that the insulating material of the body 14 was firmly pressed against the substrate coating material 22 and that a good seal was made between them. Such a good seal prevented a large portion of the vaporized material from the spark discharge from expanding along the interface between the insulating material 14 and the substrate coating material 22. I have also found that one large spark is better than a series of sparks. Apparently, when a series of sparks is generated and they extend through a hole such as 20, some of the material which has already been deposited by the initial sparks may be removed from the walls of the hole by later sparks.

Figure 9:
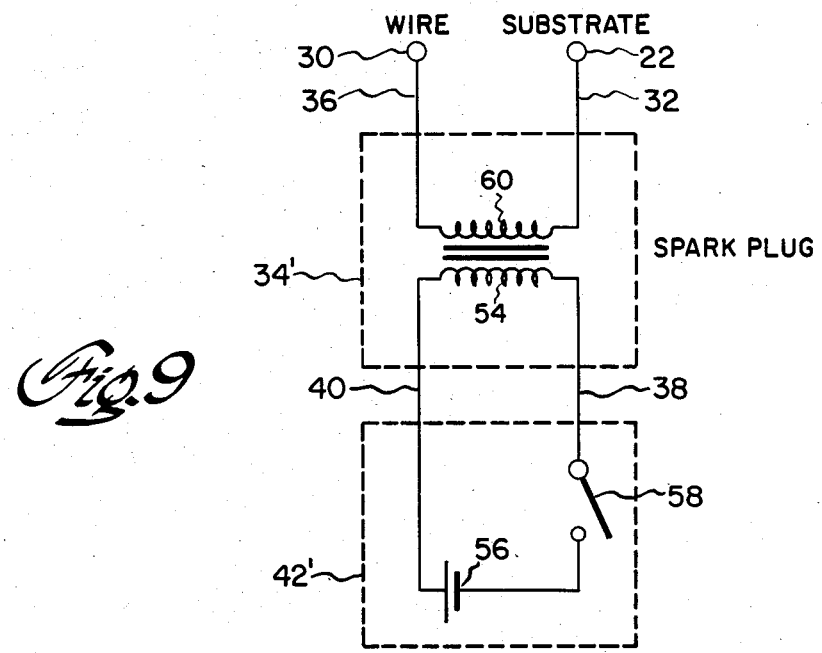
FIG. 9 is a schematic illustration of a circuit as used in connection with the present invention.

The electrical circuit used to produce the spark is shown in FIG. 9. The power supply is illustrated as included within dashed-line box 42'. It includes a 12 volt battery 56 and a mercury switch 58. The conductors 38 and 40 connect the power supply 42 to the spark coil enclosed within dashed-box 34'. The spark coil may be a conventional spark coil such as is used in a conventional automobile with a conventional 12 volt battery. Spark coil includes the primary 54 and the secondary 60. Conductor 36 connects the coil to wire electrode 30. The coil 34' is connected to substrate 22 through line 32.

Figure 6:
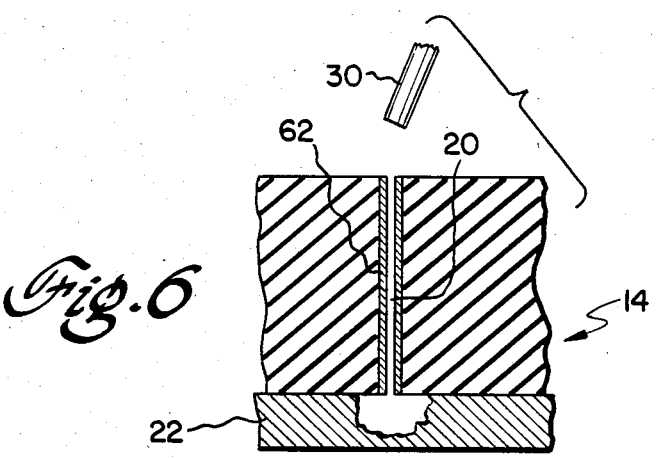
FIG. 6 is a similar section of the insulating material after the spark discharge of FIG. 5 has ceased.

Considering now, next, FIG. 6, the insulator 14 is shown in relation to the substrate 22 and the hole 20. A quantity of substrate has been vaporized by spark extending between wire 30 and substrate 22 and has caused a deposit 62 to form on the inside of the hole 20, thus providing a conductor extending through the insulating wafer 14.

Figure 7:
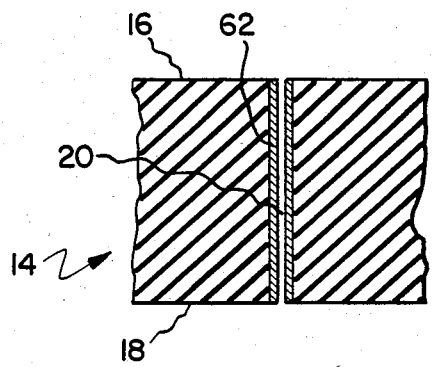
FIG. 7 is a a sectional illustration of the body of FIG. 2 coated with conductive metal.

Referring next to FIG. 7, after the substrate and spark inducing wire have been removed, the wafer 14 is seen to have a conductive layer 62 formed on the inner surface of hole 20 and extending from the lower surface 18 to the upper surface 16 of insulating wafer 14.

Referring next to FIG. 8, the wafer 14 may be plated on its upper and lower surfaces 16 and 18 respectively with the conductive layers 17 and 19 respectively. Such plating may be of the entire surface of a wafer as illustrated in FIG. 1 or may be selective of only portions or paths on the surface of such wafer to form an effective printed circuit board. Such printed circuit type board can have selected conductors through the wafer in desired locations and such through conductors can be prepared by the method of the present invention.

The use of a mercury switch 58 in connection with storage battery 56 has been found to be valuable in order to obtain a high enough dI/dt (i.e. change in current with change in time) to generate sparks.

The substrate coating material 22 is made the cathode of the circuit and the wire 30 above the hole is made the anode. A suitable wire electrode 30 is a wire of nickel chromium alloy.

The choice to make the substrate 12 the cathode and the wire 30 the anode was on the basis that a very high current density occurs in the cathode spot and this high current density is favorable to vaporization of substrate material up into the hole.

The deposit of electrical conductor onto the surfaces of wafer 14 as illustrated in FIG. 8 may be carried out by sputtering a conducting coating onto one or both faces of the insulating wafer. The sputtered coating can be patterned to form suitable interconnections between selected conducting holes.

What is claimed and sought to be protected by Letters Patent of the United States is as follows:

1. A method of forming a through conductor in a small bore hole through a wafer having a length to diameter ratio in excess of six which comprises
    disposing a vaporizable metal at the bottom of said hole,
    disposing a thin electrode over the top of the hole, and
    creating a spark between the metal and electrode to vaporize metal into and through said hole.

2. The method of claim 1 wherein the ratio is in excess of 10.

3. The method of claim 1 wherein the ratio is in excess of 20.

4. The method of claim 1 wherein the metal is copper.

* * * * *